(12) United States Patent
Ganesan et al.

(10) Patent No.: US 9,793,244 B2
(45) Date of Patent: Oct. 17, 2017

(54) SCALABLE PACKAGE ARCHITECTURE AND ASSOCIATED TECHNIQUES AND CONFIGURATIONS

(71) Applicant: INTEL CORPORATION, Santa Clara, CA (US)

(72) Inventors: Sanka Ganesan, Chandler, AZ (US); Bassam Ziadeh, Gilbert, AZ (US); Nitesh Nimkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/654,814

(22) PCT Filed: Jul. 11, 2014

(86) PCT No.: PCT/US2014/046417
§ 371 (c)(1),
(2) Date: Jun. 22, 2015

(87) PCT Pub. No.: WO2016/007176
PCT Pub. Date: Jan. 14, 2016

(65) Prior Publication Data
US 2016/0260690 A1    Sep. 8, 2016

(51) Int. Cl.
*H01L 23/48* (2006.01)
*H01L 23/52* (2006.01)
(Continued)

(52) U.S. Cl.
CPC ........ *H01L 25/0657* (2013.01); *H01L 23/293* (2013.01); *H01L 24/29* (2013.01);
(Continued)

(58) Field of Classification Search
CPC ............... H01L 25/0657; H01L 21/563; H01L 2224/32105; H01L 2224/32145;
(Continued)

(56) References Cited

U.S. PATENT DOCUMENTS

| 8,446,000 B2 | 5/2013 | Shen et al. |
| 2006/0131721 A1* | 6/2006 | Ito .................. H01L 21/6835 257/689 |

(Continued)

FOREIGN PATENT DOCUMENTS

| JP | 2003142647 A | 5/2003 |
| JP | 2006196657 A | 7/2006 |
| JP | 2007180529 A | 7/2007 |

OTHER PUBLICATIONS

Office Action dated Aug. 16, 2016 for Japan Application No. 2016-533303, 8 pages.
(Continued)

*Primary Examiner* — Dzung Tran
(74) *Attorney, Agent, or Firm* — Schwabe, Williamson & Wyatt, P.C.

(57) ABSTRACT

Embodiments of the present disclosure describe scalable package architecture of an integrated circuit (IC) assembly and associated techniques and configurations. In one embodiment, an integrated circuit (IC) assembly includes a package substrate having a first side and a second side disposed opposite to the first side, a first die having an active side coupled with the first side of the package substrate and an inactive side disposed opposite to the active side, the first die having one or more through-silicon vias (TSVs) configured to route electrical signals between the first die and a second die, and a mold compound disposed on the first side of the package substrate, wherein the mold compound is in direct contact with a sidewall of the first die between the active side and the inactive side and wherein a distance between the first side and a terminating edge of the mold compound that is farthest from the first side is equal to or
(Continued)

less than a distance between the inactive side of the first die and the first side. Other embodiments may be described and/or claimed.

9 Claims, 4 Drawing Sheets

(51) Int. Cl.
    *H01L 29/40*     (2006.01)
    *H01L 21/00*     (2006.01)
    *H01L 25/065*     (2006.01)
    *H01L 25/03*     (2006.01)
    *H01L 25/10*     (2006.01)
    *H01L 23/29*     (2006.01)
    *H01L 25/00*     (2006.01)
    *H01L 23/00*     (2006.01)

(52) U.S. Cl.
CPC .............. *H01L 24/33* (2013.01); *H01L 25/03* (2013.01); *H01L 25/105* (2013.01); *H01L 25/50* (2013.01); *H01L 24/02* (2013.01); *H01L 24/03* (2013.01); *H01L 24/08* (2013.01); *H01L 24/13* (2013.01); *H01L 24/16* (2013.01); *H01L 24/17* (2013.01); *H01L 24/27* (2013.01); *H01L 24/32* (2013.01); *H01L 24/73* (2013.01); *H01L 24/80* (2013.01); *H01L 24/81* (2013.01); *H01L 24/83* (2013.01); *H01L 24/92* (2013.01); *H01L 2224/02372* (2013.01); *H01L 2224/0381* (2013.01); *H01L 2224/08225* (2013.01); *H01L 2224/131* (2013.01); *H01L 2224/16145* (2013.01); *H01L 2224/16227* (2013.01); *H01L 2224/1703* (2013.01); *H01L 2224/17181* (2013.01); *H01L 2224/28105* (2013.01); *H01L 2224/29006* (2013.01); *H01L 2224/2919* (2013.01); *H01L 2224/32058* (2013.01); *H01L 2224/32105* (2013.01); *H01L 2224/32145* (2013.01); *H01L 2224/3301* (2013.01); *H01L 2224/33106* (2013.01); *H01L 2224/73204* (2013.01); *H01L 2224/73253* (2013.01); *H01L 2224/80903* (2013.01); *H01L 2224/81191* (2013.01); *H01L 2224/81203* (2013.01); *H01L 2224/83102* (2013.01); *H01L 2224/83191* (2013.01); *H01L 2224/83203* (2013.01); *H01L 2224/83855* (2013.01); *H01L 2224/92* (2013.01); *H01L 2224/9211* (2013.01); *H01L 2224/92125* (2013.01); *H01L 2225/0652* (2013.01); *H01L 2225/06513* (2013.01); *H01L 2225/06517* (2013.01); *H01L 2225/06541* (2013.01); *H01L 2225/06548* (2013.01); *H01L 2225/1023* (2013.01); *H01L 2225/1058* (2013.01); *H01L 2924/15311* (2013.01); *H01L 2924/18161* (2013.01)

(58) Field of Classification Search
CPC ... H01L 2224/3301; H01L 2224/33106; H01L 2224/73204; H01L 2224/73253; H01L 2224/80903; H01L 2224/81191; H01L 2224/83203; H01L 2224/83855; H01L 2224/92; H01L 23/28; H01L 23/293; H01L 23/48; H01L 24/29; H01L 24/33; H01L 25/03; H01L 25/105; H01L 25/50; H01L 24/02; H01L 24/03; H01L 24/08; H01L 24/13; H01L 24/17; H01L 24/27; H01L 24/32
USPC .......................... 257/737, 774, 777; 438/127
See application file for complete search history.

(56) References Cited

U.S. PATENT DOCUMENTS

| | | |
|---|---|---|
| 2008/0017976 A1 | 1/2008 | Lai et al. |
| 2008/0090085 A1* | 4/2008 | Kawate .................. C09J 7/0203 |
| | | 428/413 |
| 2009/0278244 A1* | 11/2009 | Dunne .................. H01L 23/481 |
| | | 257/676 |
| 2010/0013081 A1* | 1/2010 | Toh ...................... H01L 21/6835 |
| | | 257/692 |
| 2010/0102446 A1 | 4/2010 | Katsurayama et al. |
| 2010/0159643 A1* | 6/2010 | Takahashi ............... H01L 21/56 |
| | | 438/108 |
| 2011/0227226 A1 | 9/2011 | Chiang et al. |
| 2011/0272814 A1 | 11/2011 | Wachtler et al. |
| 2012/0070939 A1 | 3/2012 | Dunne et al. |
| 2012/0080787 A1 | 4/2012 | Shah et al. |
| 2012/0306085 A1* | 12/2012 | West ..................... H01L 23/481 |
| | | 257/762 |
| 2013/0001710 A1 | 1/2013 | Daneman et al. |

OTHER PUBLICATIONS

International Search Report and Written Opinion dated Mar. 31, 2015, issued in corresponding International Application No. PCT/US2014/046417, filed Jul. 11, 2014, 11 pages.
Office Action dated Feb. 21, 2017 for Japanese Patent Application No. 2016-533303, 8 pages.
Search Report dated Mar. 7, 2017 for Taiwanese Patent Application No. 104118155, 2 pages.

* cited by examiner

SCALABLE PACKAGE ARCHITECTURE AND ASSOCIATED TECHNIQUES AND CONFIGURATIONS

FIELD

Embodiments of the present disclosure generally relate to the field of integrated circuit (IC) assemblies, and more particularly, to scalable package architecture and associated techniques and configurations.

BACKGROUND

Currently, emerging integrated circuit (IC) assemblies may include three dimensional (3D) package architecture where one or more dies (e.g., memory dies) are stacked on another die (e.g., a system-on-chip die). The stacked dies may overhang the underlying die in some configurations, which may result in risks of defects such as cracking of the stacked dies. Currently, shrink scaling of the underlying die or the overhang may be undesirably restricted in order to mitigate such risks. Additionally, as IC assemblies continue to shrink to smaller dimensions, it may be desirable to provide a smaller Z-height of a 3D package architecture for smaller devices such as mobile devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
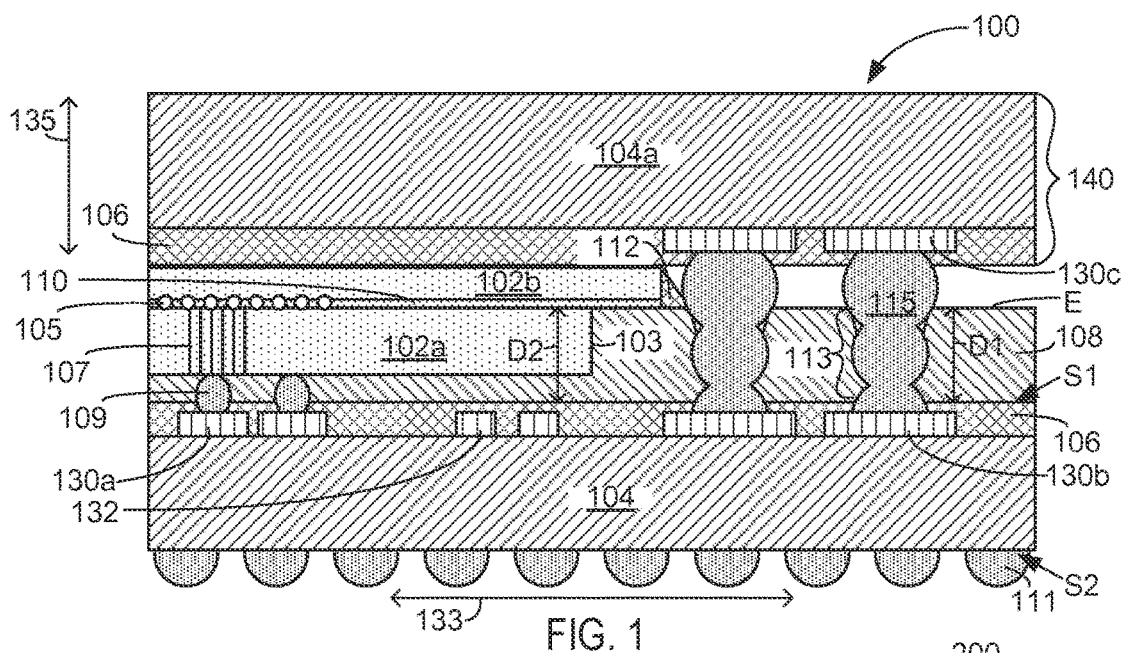
FIG. 1 schematically illustrates a cross-section side view of an example integrated circuit (IC) assembly, in accordance with some embodiments.

Embodiments of the present disclosure describe scalable package architecture of an integrated circuit (IC) assembly and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100, in accordance with some embodiments. According to various embodiments, the IC assembly 100 may represent a three dimensional (3D) package architecture where one or more dies are stacked on another die. For example, in some embodiments, a first die 102a may be coupled with a package substrate 104 and a second die 102b may be stacked on the first die 102a. The depicted IC assembly 100 may only represent a portion of an IC assembly in some embodiments.

According to various embodiments, the IC assembly 100 may include a package substrate 104 having a first side, S1, and a second side, S2, disposed opposite to the first side S1. In some embodiments, the package substrate 104 is an epoxy-based laminate substrate having a core and/or build-up layers such as, for example, an Ajinomoto Build-up Film (ABF) substrate. In other embodiments, the package substrate 104 may be a circuit board such as, for example, a printed circuit board (PCB) formed using any suitable PCB technique. The package substrate 104 may include other suitable types of substrates in other embodiments including, for example, substrates formed from glass, ceramic, or semiconductor materials.

The package substrate 104 may include electrical routing features configured to route electrical signals such as, for example, input/output (I/O) signals or power/ground to or from one or more dies (e.g., first die 102a). The electrical routing features may include, for example, pads 130a, 130b or traces 132 disposed on one or more surfaces of the package substrate 104 and/or internal routing features (not shown) such as, for example, conductive lines, vias, or other interconnect structures to route electrical signals through the package substrate 104. For example, in the depicted embodiment, the package substrate 104 includes pads 130a (which may also be referred to as "lands") configured to receive die-level interconnects 109 of the die 102 and pads 130b configured to receive package-level interconnects (e.g., through-mold interconnects 113) of another IC device 140 on the first side S1. A solder resist layer 106 may be disposed on an outer surface of the first side S1 of the package substrate 104, as can be seen, in some embodiments. The internal routing features or traces 132 of the package substrate 104 may be configured to route electrical signals between the first die 102a and/or second die 102b and one or more electrical devices (e.g., dies) of the IC device 140.

Figure 4:
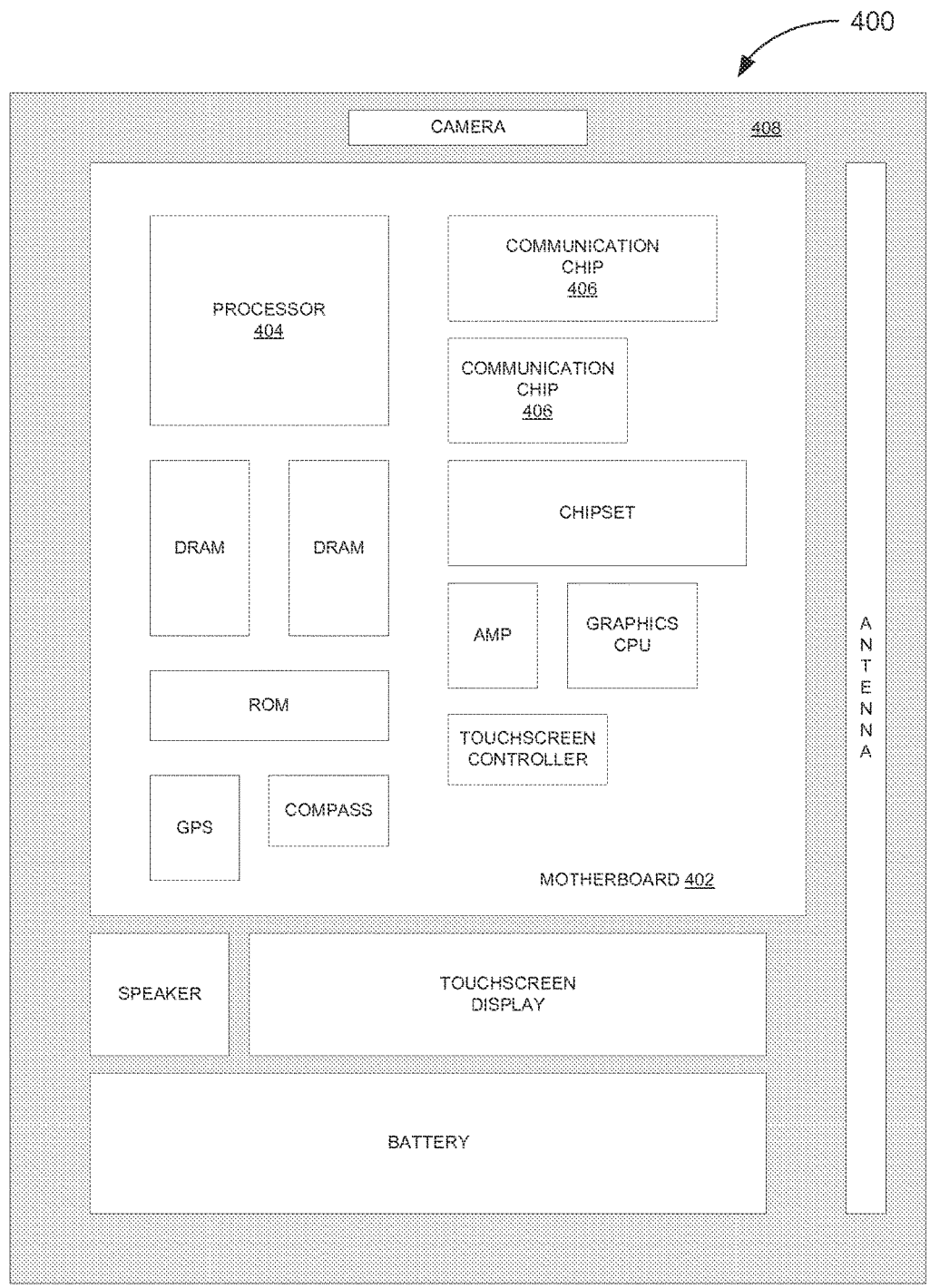
FIG. 4 schematically illustrates a computing device that includes an IC assembly as described herein, in accordance with some embodiments.

One or more package-level interconnects such as, for example, one or more solder balls 111 may be formed on the second side S2 of the package substrate 104 to facilitate coupling of the package substrate 104 with other electrical devices such as, for example, a circuit board (e.g., motherboard 402 of FIG. 4). Although not shown to avoid obscuring aspects of the depicted embodiment, the solder balls 111 may be coupled with corresponding pads disposed on the second side S2 of the package substrate 104.

A first die 102a may be coupled with the package substrate 104. The first die 102a can be attached to the package substrate 104 according to a wide variety of suitable configurations including, for example, being directly coupled with the package substrate 104 in a flip-chip configuration, as depicted. In the flip-chip configuration, an active side of the first die 102a including active circuitry is attached to a surface of the package substrate 104 using die-level interconnect structures 109 such as bumps, pillars, or other suitable structures that may also electrically couple the first die 102a with the package substrate 104. An inactive side may be disposed opposite to the active side of the first die 102a.

In some embodiments, the first die 102a may include one or more through-silicon vias (TSVs) 107 configured to route electrical signals between the first die 102a and a second die 102b coupled with the first die 102a. For example, the TSVs 107 may electrically couple active circuitry on the active side of the first die 102a with die-to-die interconnects 105 such as bumps, pillars, or other suitable structures that couple the second die 102b with the first die 102a. In the depicted embodiments, an active side of the second die 102b is attached to an inactive side of the first die 102a in a flip-chip configuration using the die-to-die interconnects 105, which may be electrically coupled with the TSVs 107.

The first die 102a and/or the second die 102b may represent a discrete product made from a semiconductor material (e.g., silicon) using semiconductor fabrication techniques such as thin film deposition, lithography, etching and the like used in connection with forming complementary metal-oxide-semiconductor (CMOS) devices. In some embodiments, the first die 102a and/or the second die 102b may be, include, or be a part of a processor, memory, system-on-chip (SoC), or ASIC. In one embodiment, the first die 102a may represent an SoC die and the second die 102b may represent a memory die.

According to various embodiments, a mold compound 108 may be formed on the first side S1 of the package substrate 104. The mold compound 108 may be composed of an electrically insulative material such as, for example, a polymer that is formed to encapsulate and protect features of the IC assembly 100 from environmental hazards such as moisture or oxidation. In some embodiments, the mold compound 108 may be in direct contact with a sidewall 103 of the first die 102a between the active side and the inactive side of the first die 102a, as can be seen.

In some embodiments, a distance, D1, between the first side S1 of the package substrate 104 and a terminating edge, E, of the mold compound 108 that is farthest from the first side S1 may be equal to or less than a distance, D2, between the first side S1 of the package substrate 104 and the inactive side of the first die 102a. Providing a mold compound 108 that is configured in such a manner may allow bonding of the second die 102b to the mold compound 108. For example, in the depicted embodiment, the second die 102b may extend farther in a direction (e.g., indicated by arrow 133) that is parallel with a plane generally defined by the first side S1 of the package substrate 104. Further, in the depicted embodiment, the terminating edge E of the mold compound 108 is substantially planar or flush with the inactive side of the first die 102a such that the second die 102b is mounted, in part, on the terminating edge E of the mold compound 108. The structural support provided by the mold compound 108 may reduce stresses on the overhanging portion of the second die 102b, which may reduce defects such as cracking of the second die 102b, or may allow shrink-scaling of the first die 102a and/or second die 102b, or allow a greater overhanging portion of the second die 102b without cracking, or allow shrinking of a Z-height (e.g., in the direction indicated by arrow 135) of the IC assembly relative to an IC assembly that does not have a mold compound 108 configured as described.

In other embodiments, at least a portion of the second die 102b may extend in other directions that are parallel with the plane defined by the first side S1 such as, for example, in or out of the page of FIG. 1. In other embodiments, the distance D1 may be less than D2 and another intermediate material may be disposed between an overhanging portion of the second die 102b and the mold compound 108 such as, for example, an epoxy-based material (e.g., epoxy-based film 110) or other suitable material.

In some embodiments, an epoxy-based film 110 may be disposed on the inactive side of the first die 102a between the first die 102a and the second die 102b and may be further disposed on the terminating edge E of the mold compound 108 between the second die 102b and the terminating edge E of the mold compound 108. The epoxy-based film 110 may, for example, include an epoxy flux film in some embodiments.

In some embodiments, an underfill material 112 may be in direct contact with or cover a sidewall of the second die 102b between an active side and inactive side of the second die 102b, as can be seen for example in the depicted embodiment. The underfill material 112 may be disposed on the terminating edge E of the mold compound 108. The underfill material 112 may be configured to protect an edge of the second die 102b from environmental or handling hazards. In some embodiments, the underfill material 112 may be composed of an epoxy-based material or any other suitable material. Although not depicted, in other embodiments, an underfill material may be disposed between the active side of the first die 102a and the first side S1 of the package substrate 104 instead of mold compound 108.

In some embodiments, one or more through-mold interconnects (TMIs) 113 may be formed through the mold compound 108 to allow coupling of an IC device 140 with the package substrate 104. The one or more TMIs 113 may include openings formed through the mold compound 108 that are filled with an electrically conductive material such as, for example, solderable material 115. The solderable material 115 may include, for example, one or more solder balls that are reflowed to form a solder joint between pads 130b on the package substrate and pads 130c on the IC device.

The IC device 140 may represent a wide variety of suitable devices including, for example, dies or other package assemblies such as a memory package. In the depicted embodiment, the IC device 140 includes a package substrate 104a, which may comport with embodiments described in connection with package substrate 104, and a solder resist layer 106 formed on the package substrate 104a. The first die 102a and the second die 102b may be disposed between the first side S1 of the package substrate 104 and the IC device 140. The IC device 140 may include a wide variety of other suitable configurations in other embodiments.

FIGS. 2a-h schematically illustrate a cross-section side view of an example integrated circuit (IC) assembly 200 during various stages of fabrication, in accordance with some embodiments. The IC assembly 200 may comport with embodiments described in connection with IC assembly 100 of FIG. 1 and vice versa. Some reference labels may not be duplicated in each of the FIGS. 2a-h to avoid obscuring aspects of the described embodiment.

Figure 2A:
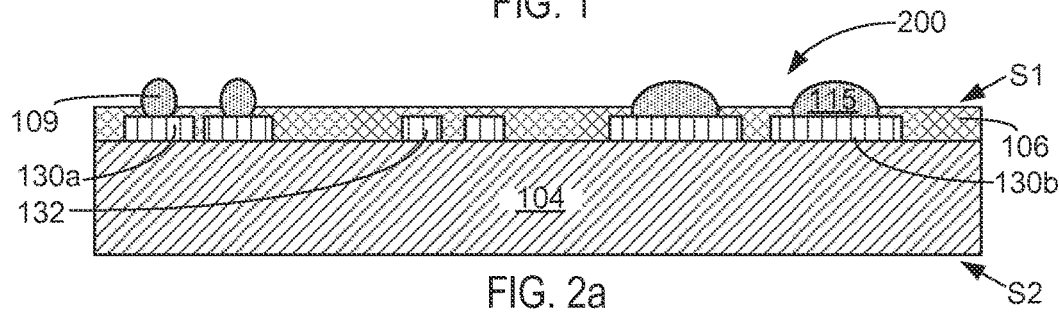
FIGS. 2a-h schematically illustrate a cross-section side view of an example integrated circuit (IC) assembly during various stages of fabrication, in accordance with some embodiments.

Referring to FIG. 2a, an IC assembly 200 is depicted subsequent to providing or fabricating a package substrate 104. The package substrate 104 may include, for example, a first side S1 disposed opposite to a second side S2, pads 130a, 130b, traces 132, solder resist layer 106, die-level interconnects 109 and solderable material 115 as described in connection with the IC assembly 100 of FIG. 1. In some embodiments, the die-level interconnects 109 may include solder of a controlled collapse chip connection (C4) and the pads 130b may be referred to as package-on-package (POP) lands.

Figure 2B:
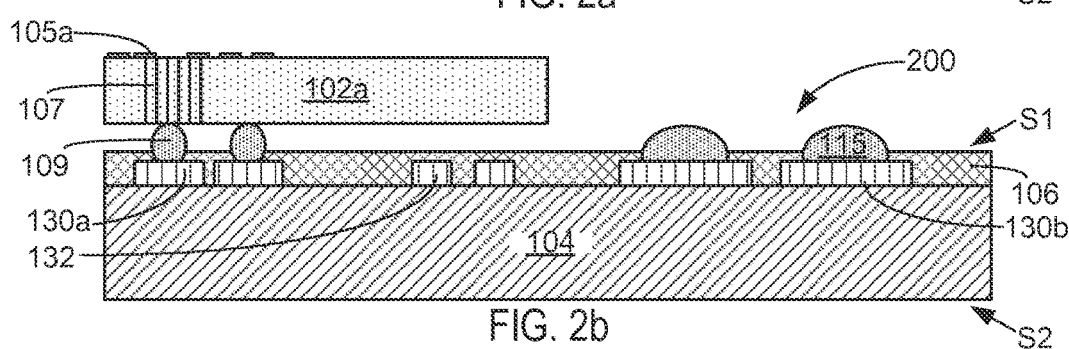

Referring to FIG. 2b, the IC assembly 200 is depicted subsequent to coupling an active side of a first die 102a with the first side S1 of the package substrate 104 in a flip-chip configuration using the die-level interconnects 109. In other embodiments, the die-level interconnects 109 (e.g., solderable material) may be deposited on the first die 102a prior to coupling the first die 102a with the pads 130a. The first die 102a may include one or more TSVs 107 configured to route electrical signals between the first die 102a and a second die (e.g., second die 102b of FIG. 2e) and redistribution features 105a such as pads and/or traces formed on an inactive side of the first die 102a to receive die-to-die interconnects such as logic-memory interconnects (LMIs) for coupling the second die with the first die 102a.

Figure 2C:
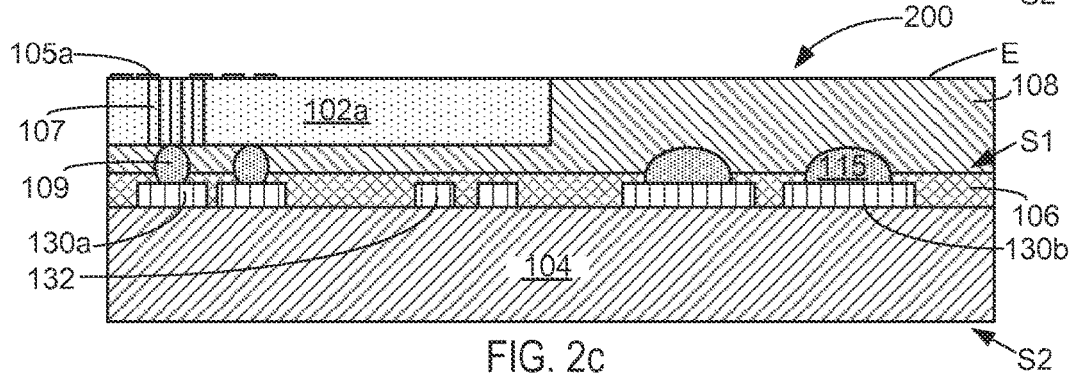

Referring to FIG. 2c, the IC assembly 200 is depicted subsequent to forming a mold compound 108 on the first side S1 of the package substrate 104. In some embodiments, the mold compound 108 may be formed into an exposed die mold (ExDM) such that the inactive side of the first die 102a remains exposed and a terminating edge E of the mold compound 108 is level with or below a level of the inactive side of the first die 102a relative to the first side S1 of the package substrate. The mold compound 108 may be deposited, for example, by compression or transfer moldings, spincoating or slickcoating, lamination or any other suitable technique.

Figure 2D:
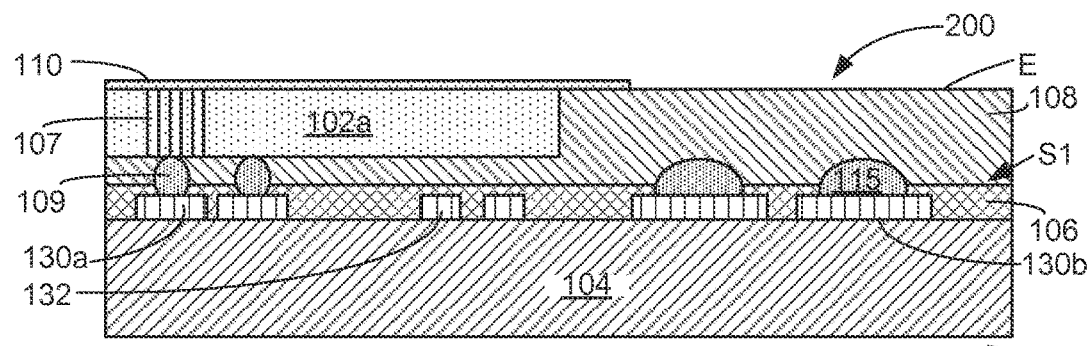

Referring to FIG. 2d, the IC assembly 200 is depicted subsequent to depositing an epoxy-based film 110 on the inactive side of the first die 102a. In some embodiments, the epoxy-based film 110 may be further deposited on the terminating edge E of the mold compound 108. In some embodiments, the epoxy-based film 110 may include a flux to facilitate formation of electrical connections between the first die 102a and a second die to be stacked on the first die 102a. Prior to depositing the epoxy-based film 110, the redistribution features 105a may be cleaned as well as the terminating edge E of the mold compound. The epoxy-based film 110 may be deposited, for example, by dispensing epoxy flux or attaching an epoxy flux film using any other suitable means. Suitable electrically insulative materials other than epoxy-based materials may be deposited on the first die 102a in other embodiments.

Figure 2E:
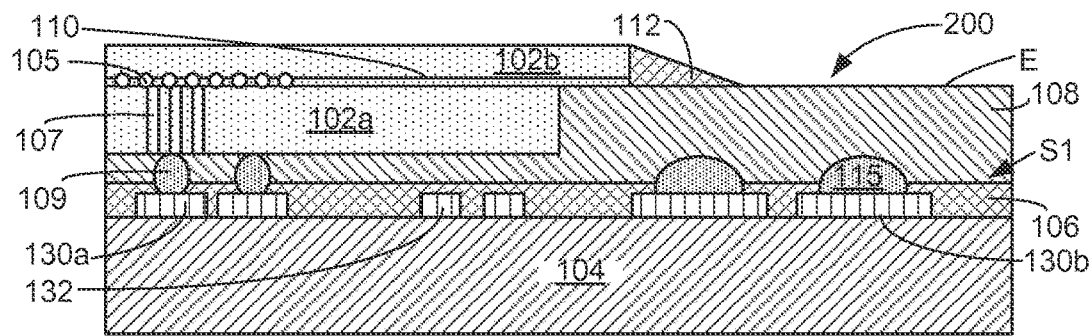

Referring to FIG. 2e, the IC assembly 200 is depicted subsequent to coupling the second die 102b with the first die 102a in a stacked flip-chip configuration. The second die 102b may be coupled with the first die 102a using, for example, thermocompression bonding to form die-to-die interconnects 105 and/or in-situ cure of the epoxy-based film 110. An underfill material 112 may be deposited in direct contact with a sidewall of the second die 102b, as can be seen, and in direct contact with the mold compound 108 to form a protective barrier at an edge of the second die 102b. The underfill material 112 may be deposited, for example, by capillary dispense process.

Figure 2F:
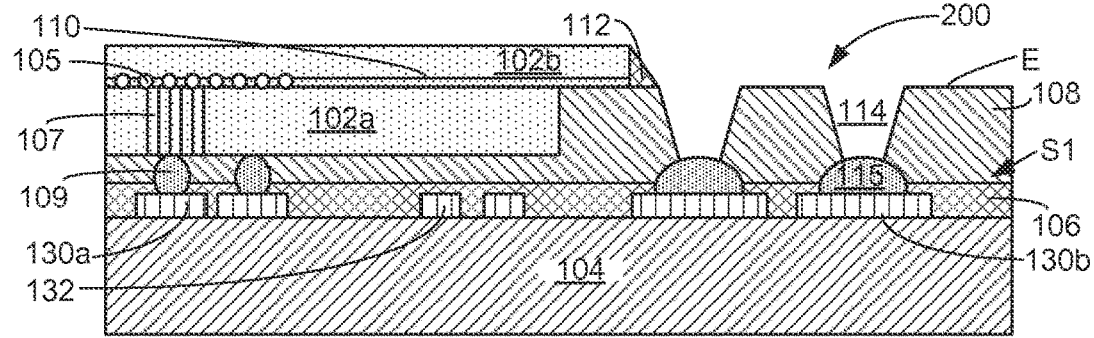

Referring to FIG. 2f, the IC assembly 200 is depicted subsequent to forming openings 114 in the mold compound 108 to expose solderable material 115 on the pads 130b as part of the formation of TMIs (e.g., TMIs 113 of FIG. 1). In other embodiments, the openings 114 may be formed to expose the pads 130b (e.g., no solderable material 115 may be disposed on the pads 130b). The openings 114 may be, for example, laser vias formed by a laser drilling technique. The openings 114 may be formed according to other suitable techniques in other embodiments.

Figure 2G:
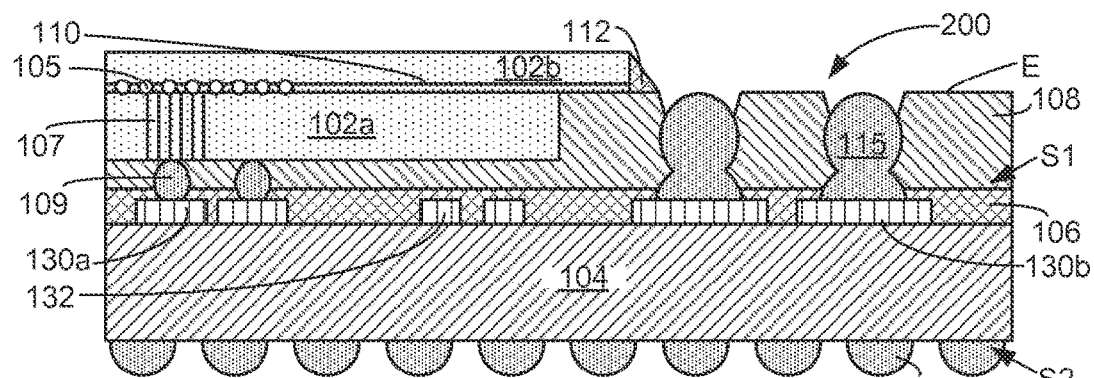

Referring to FIG. 2g, the IC assembly 200 is depicted subsequent to applying flux and placing solderable material 115 (e.g., one or more solder balls) into the openings 114 and reflowing the solderable material to fuse the solderable material 115 with solderable material already in the openings 114 or with the pads 130b if no solderable material is already disposed on the pads 130b. Further, in some embodiments, one or more solder balls 111 or other package-level interconnects may be attached or otherwise formed on the second side S2 of the package substrate 104 to facilitate coupling of the package substrate 104 with other electrical devices such as, for example, a circuit board.

Figure 2H:
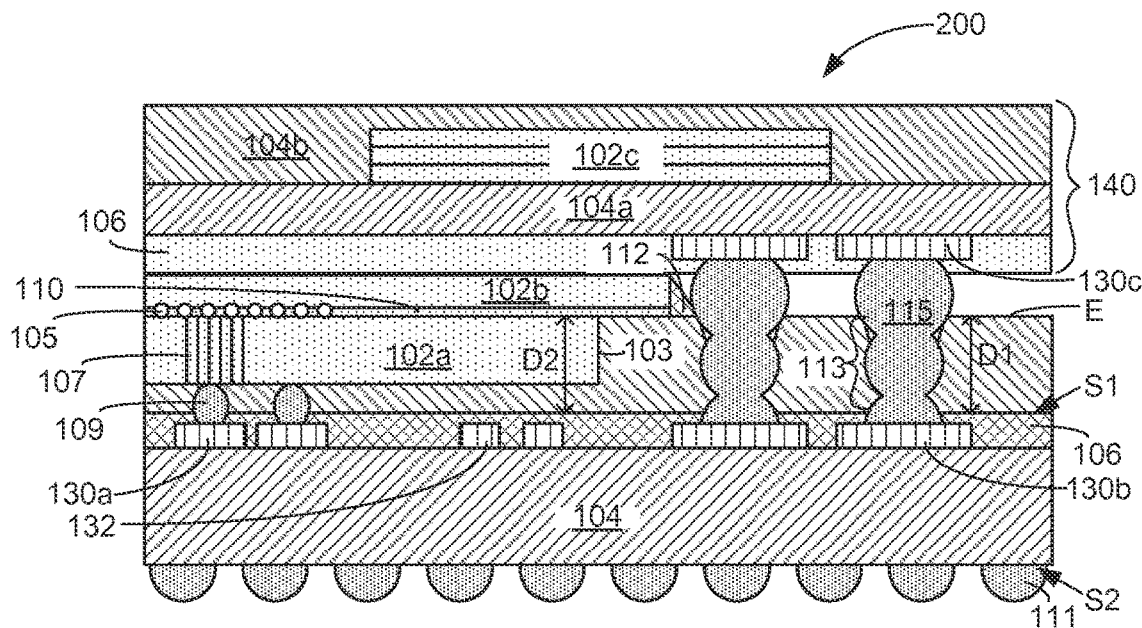

Referring to FIG. 2h, the IC assembly 200 is depicted subsequent to coupling an IC device 140 with the first side S1 of the package substrate 104 through the one or more TMIs 113. In some embodiments, the IC device 140 may be a memory package having a package substrate 104a and one or more memory dies 102c disposed on the package substrate 104a. In some embodiments, the one or more memory dies 102c may be encapsulated in an electrically insulative material 104b such a mold compound or a laminate or other suitable structure. Pads 130c on the package substrate 104a may be coupled with corresponding pads 130b on the package substrate 104 using a reflow process to form a solder joint using solderable material 115. The IC device 140 may represent a wide variety of suitable IC devices including dies, packages or other suitable electrical assemblies.

Figure 3:
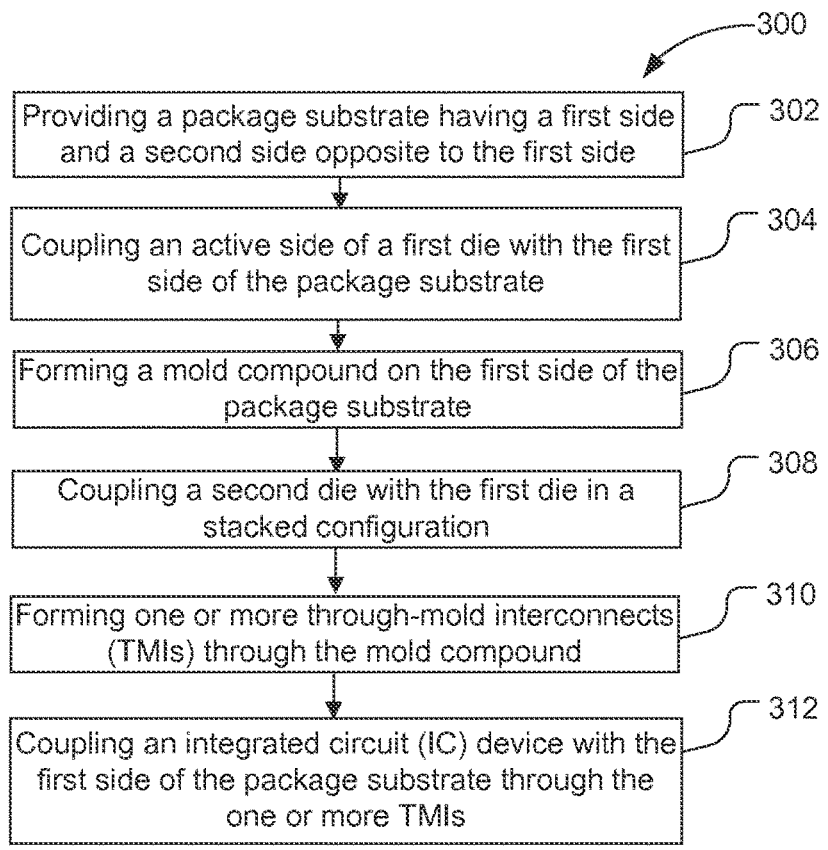
FIG. 3 schematically illustrates a flow diagram for a method of fabricating an integrated circuit (IC) assembly, in accordance with some embodiments.

FIG. 3 schematically illustrates a flow diagram for a method 300 of fabricating an integrated circuit (IC) assembly, in accordance with some embodiments. The method 300 may comport with embodiments described in connection with FIGS. 1-2h and vice versa.

At 302, the method 300 may include providing a package substrate (e.g., package substrate 104 of FIG. 2a) having a first side (e.g., first side S1 of FIG. 2a) and a second side (e.g., second side S2 of FIG. 2a) opposite to the first side.

At 304, the method 300 may include coupling an active side of a first die (e.g., first die 102a of FIG. 2b) with the first side of the package substrate. The first die may include one or more TSVs (e.g., TSVs 107 of FIG. 2b) and may be attached in a flip-chip configuration.

At 306, the method 300 may include forming a mold compound (e.g., mold compound 108 of FIG. 2c) on the first side of the package substrate. In some embodiments, the mold compound is in direct contact with a sidewall (e.g., sidewall 103 of FIG. 1) of the first die. A distance (e.g., distance D1 of FIG. 1) between the first side and a terminating edge (e.g., terminating edge E of FIG. 1) of the mold compound that is farthest from the first side may be equal to or less than a distance (e.g., distance D2 of FIG. 1) between the inactive side of the first die and the first side of the package substrate. The terminating edge may be substantially planar in some embodiments.

At 308, the method 300 may include coupling a second die (e.g., second die 102b of FIG. 2e) with the first die in a stacked configuration. An epoxy-based film (e.g., epoxy-based film 110 of FIG. 2d) may be deposited on the inactive side of the first die and on the terminating edge of the mold compound. The second die may be coupled with the first die by thermocompression, for example, using die-to-die interconnects (e.g., die-to-die interconnects 105 of FIG. 2e). An underfill material (e.g., underfill material 112 of FIG. 2e) may be deposited in direct contact with a sidewall of the second die and on the terminating edge of the mold compound.

At 310, the method 300 may include forming one or more through-mold interconnects (TMIs) (e.g., TMIs 113 of FIG. 2h) through the mold compound. The TMIs may be formed, for example, by drilling openings through the mold compound using a laser process and filling the openings with solderable material.

At 312, the method 300 may include coupling an integrated circuit (IC) device (e.g., IC device 140 of FIG. 2h) with the first side of the package substrate through the one or more TMIs. The IC device may be coupled with the package substrate using a solder reflow process to form a joint between solderable material in the TMIs and respective pads on the IC device and package substrate.

Various operations are described as multiple discrete operations in turn, in a manner that is most helpful in understanding the claimed subject matter. However, the order of description should not be construed as to imply that these operations are necessarily order dependent.

Embodiments of the present disclosure may be implemented into a system using any suitable hardware and/or software to configure as desired. FIG. 4 schematically illustrates a computing device 400 that includes an IC assembly (e.g., IC assembly 100 of FIG. 1 or IC assembly 200 of FIGS. 2a-h) as described herein, in accordance with some embodiments. The computing device 400 may house a board such as motherboard 402 (e.g., in housing 408). The motherboard 402 may include a number of components, including but not limited to a processor 404 and at least one communication chip 406. The processor 404 may be physically and electrically coupled to the motherboard 402. In some implementations, the at least one communication chip 406 may also be physically and electrically coupled to the motherboard 402. In further implementations, the communication chip 406 may be part of the processor 404.

Depending on its applications, computing device 400 may include other components that may or may not be physically and electrically coupled to the motherboard 402. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other embodiments.

The computing device 400 may include a plurality of communication chips 406. For instance, a first communication chip 406 may be dedicated to shorter range wireless communications such as WiGig, Wi-Fi and Bluetooth and a second communication chip 406 may be dedicated to longer range wireless communications such as GPS, EDGE, GPRS, CDMA, WiMAX, LTE, EV-DO, and others.

The processor 404 of the computing device 400 may be packaged in an IC assembly (e.g., IC assembly 100 of FIG. 1 or IC assembly 200 of FIGS. 2*a-h*) as described herein. For example, the processor 404 may be the first die 102*a* mounted on package substrate 104 of FIG. 1. The package substrate 104 and the motherboard 402 may be coupled together using package-level interconnects such as solder balls 111. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 406 may also include a die (e.g., RF die) that may be packaged in an IC assembly (e.g., IC assembly 100 of FIG. 1 or IC assembly 200 of FIGS. 2*a-h*) as described herein. In further implementations, another component (e.g., memory device or other integrated circuit device) housed within the computing device 400 may include a die that may be packaged in an IC assembly (e.g., IC assembly 100 of FIG. 1 or IC assembly 200 of FIGS. 2*a-h*) as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 400 may be a mobile computing device in some embodiments. In further implementations, the computing device 400 may be any other electronic device that processes data.

EXAMPLES

According to various embodiments, the present disclosure describes an apparatus (e.g., an integrated circuit (IC) assembly). Example 1 of an IC assembly may include a package substrate having a first side and a second side disposed opposite to the first side, a first die having an active side coupled with the first side of the package substrate and an inactive side disposed opposite to the active side, the first die having one or more through-silicon vias (TSVs) configured to route electrical signals between the first die and a second die, and a mold compound disposed on the first side of the package substrate, wherein the mold compound is in direct contact with a sidewall of the first die between the active side and the inactive side and wherein a distance between the first side and a terminating edge of the mold compound that is farthest from the first side is equal to or less than a distance between the inactive side of the first die and the first side. Example 2 may include the IC assembly of Example 1, wherein the terminating edge of the mold compound is substantially planar with the inactive side of the die. Example 3 may include the IC assembly of Example 1, further comprising the second die, wherein the second die is mounted on the first die in a flip-chip configuration. Example 4 may include the IC assembly of Example 3, wherein the first side of the package substrate generally defines a plane and at least a portion of the second die extends farther in a direction that is parallel with the plane than the first die. Example 5 may include the IC assembly of Example 4, wherein the second die is mounted, at least in part, on the terminating edge of the mold compound. Example 6 may include the IC assembly of Example 5, further comprising an epoxy-based film disposed on the inactive side of the first die between the first die and the second die and further disposed on the terminating edge of the mold compound between the second die and the terminating edge of the mold compound. Example 7 may include the IC assembly of Example 6, wherein the second die has an active side coupled with the first die and an inactive side disposed opposite to the active side, the IC assembly further comprising an underfill material in direct contact with a sidewall of the second die between the active side and the inactive side of the second die and further in direct contact with the terminating edge of the mold compound. Example 8 may include the IC assembly of any of Examples 1-7, further comprising one or more through-mold interconnects formed through the mold compound and an integrated circuit (IC) device coupled with the first side of the package substrate through the one or more through-mold interconnects, wherein the first die and the second die are disposed between the first side of the package substrate and the IC device. Example 9 may include the IC assembly of Example 8, wherein the first die is a system-on-chip (SoC) die, the second die is a memory die, and the IC device is a memory package.

According to various embodiments, the present disclosure describes a method of fabricating an IC assembly. Example 10 of a method may include providing a package substrate having a first side and a second side disposed opposite to the first side, coupling an active side of a first die with the first side of the package substrate, the first die including an inactive side disposed opposite to the active side and one or more through-silicon vias (TSVs) configured to route electrical signals between the first die and a second die, and forming a mold compound on the first side of the package substrate, wherein the mold compound is in direct contact with a sidewall of the first die between the active side and the inactive side and wherein a distance between the first side and a terminating edge of the mold compound that is farthest from the first side is equal to or less than a distance between the inactive side of the first die and the first side.

Example 11 may include the method of Example 10, wherein the terminating edge of the mold compound is substantially planar with the inactive side of the die. Example 12 may include the method of Example 10, further comprising coupling the second die with the first die in a flip-chip configuration. Example 13 may include the method of Example 12, wherein the first side of the package substrate generally defines a plane and at least a portion of the second die extends farther in a direction that is parallel with the plane than the first die. Example 14 may include the method of Example 13, wherein the second die is coupled with the terminating edge of the mold compound. Example 15 may include the method of Example 14, further comprising depositing an epoxy-based film such that the epoxy-based film is disposed on the inactive side of the first die between the first die and the second die and further disposed on the terminating edge of the mold compound between the second die and the terminating edge of the mold compound. Example 16 may include the method of Example 15, wherein the second die has an active side coupled with the first die and an inactive side disposed opposite to the active side, the method further comprising depositing an underfill material in direct contact with a sidewall of the second die between the active side and the inactive side of the second die and further in direct contact with the terminating edge of the mold compound. Example 17 may include the method of any of Examples 10-16, further comprising forming one or more through-mold interconnects through the mold compound and coupling an integrated circuit (IC) device with the first side of the package substrate through the one or more through-mold interconnects, wherein the first die and the second die are disposed between the first side of the package substrate and the IC device. Example 18 may include the method of Example 17, wherein the first die is a system-on-chip (SoC) die, the second die is a memory die, and the IC device is a memory package.

According to various embodiments, the present disclosure may describe a system (e.g., a computing device). Example 19 of a computing device may include a circuit board and an integrated circuit (IC) assembly coupled with the circuit board, the IC assembly comprising a package substrate having a first side and a second side disposed opposite to the first side, a first die having an active side coupled with the first side of the package substrate and an inactive side disposed opposite to the active side, the first die having one or more through-silicon vias (TSVs) configured to route electrical signals between the first die and a second die, and a mold compound disposed on the first side of the package substrate, wherein the mold compound is in direct contact with a sidewall of the first die between the active side and the inactive side and wherein a distance between the first side and a terminating edge of the mold compound that is farthest from the first side is equal to or less than a distance between the inactive side of the first die and the first side. Example 20 may include the computing device of Example 19, wherein the computing device is a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) assembly comprising:
   a package substrate having a first side and a second side disposed opposite to the first side;
   a first die having an active side coupled with the first side of the package substrate and an inactive side disposed opposite to the active side, the first die having one or more through-silicon vias (TSVs) configured to route electrical signals between the first die and a second die;
   a mold compound disposed on the first side of the package substrate, wherein the mold compound is in direct contact with a sidewall of the first die between the active side and the inactive side and wherein a distance between the first side and a terminating edge of the mold compound that is farthest from the first side is equal to or less than a distance between the inactive side of the first die and the first side;
   the second die mounted on the first die, and mounted, at least in part, on the terminating edge of the mold compound;
   an epoxy-based material disposed on the inactive side of the first die between the first die and the second die and further disposed on the terminating edge of the mold compound between the second die and the terminating edge of the mold compound; and
   an underfill material in direct contact with a sidewall of the second die, in direct contact with the epoxy-based material, and further in direct contact with the terminating edge of the mold compound, wherein the underfill material is different from the epoxy-based material.

2. The IC assembly of claim 1, wherein:
   the terminating edge of the mold compound is substantially planar with the inactive side of the first die.

3. The IC assembly of claim 1,
   wherein the second die is mounted on the first die in a flip-chip configuration.

4. The IC assembly of claim 3, wherein:
   the first side of the package substrate generally defines a plane; and
   at least a portion of the second die extends farther in a direction that is parallel with the plane than the first die.

5. The IC assembly of claim 1, wherein the underfill material includes a capillary underfill material.

6. The IC assembly of claim 1, wherein the epoxy-based material includes an epoxy flux film.

7. The IC assembly of claim 1, wherein the second die has an active side coupled with the first die and an inactive side disposed opposite to the active side, and
   the underfill material is in direct contact with the sidewall of the second die between the active side and the inactive side of the second die.

8. The IC assembly of claim 1, further comprising:
   one or more through-mold interconnects formed through the mold compound; and
   an integrated circuit (IC) device coupled with the first side of the package substrate through the one or more through-mold interconnects, wherein the first die and the second die are disposed between the first side of the package substrate and the IC device, the IC device is mounted over the first die and the second die, the first side of the package substrate generally defines a plane, at least a portion of the IC device extends farther than the first die and the second die in a direction that is parallel with the plane, and the one or more through-mold interconnects are coupled with a portion of the first side of the package substrate that extends farther than the first die and the second die in a direction that is parallel with the plane.

9. The IC assembly of claim 1, wherein:
the first die is a system-on-chip (SoC) die;
the second die is a memory die; and
the IC device is a memory package.

* * * * *